US007692469B2

(12) United States Patent
Kadanka

(10) Patent No.: US 7,692,469 B2

(45) Date of Patent: Apr. 6, 2010

(54) VOLTAGE SENSE CIRCUIT AND METHOD THEREFOR

(75) Inventor: Petr Kadanka, Valasska Bystrice (CS)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1059 days.

(21) Appl. No.: 11/105,255

(22) Filed: Apr. 14, 2005

(65) Prior Publication Data

US 2006/0232257 A1 Oct. 19, 2006

(51) Int. Cl.
*H03K 5/08* (2006.01)

(52) U.S. Cl. ........................................ 327/330; 327/531

(58) Field of Classification Search ........................ None
See application file for complete search history.

(56) References Cited

U.S. PATENT DOCUMENTS

| | | | | |
|---|---|---|---|---|
| 4,335,358 | A * | 6/1982 | Hoeft | 330/255 |
| 5,488,301 | A * | 1/1996 | Werner et al. | 324/458 |
| 5,933,342 | A * | 8/1999 | Callanan | 363/126 |
| 6,034,489 | A * | 3/2000 | Weng | 315/307 |
| 6,169,374 | B1 * | 1/2001 | Chang | 315/224 |
| 7,161,431 | B2 * | 1/2007 | Kronmueller | 330/255 |
| 7,505,291 | B2 * | 3/2009 | Wang et al. | 363/89 |
| 7,564,706 | B1 * | 7/2009 | Herbert | 363/124 |
| 7,567,446 | B2 * | 7/2009 | Sugino et al. | 363/37 |

* cited by examiner

*Primary Examiner*—Tuan Lam
*Assistant Examiner*—Hiep Nguyen
(74) *Attorney, Agent, or Firm*—Robert F. Hightower

(57) ABSTRACT

In one embodiment, a voltage sense circuit receives an ac input signal and forms a rectified output voltage that is representative of the ac input signal.

17 Claims, 2 Drawing Sheets

VOLTAGE SENSE CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various methods and circuits to produce voltage sense circuit. The voltage sense circuits typically received an input voltage and formed an output voltage that was a rectified representation of the input voltage. The voltage sense circuit also generated a zero crossing signal that represented the zero crossing of the input signal. Typically, several operational amplifiers that operated at multiple power supplies were required to produce the voltage sense of circuit. Providing the multiple power supplies to operate the voltage sense circuit increased the cost of the voltage sense circuit.

Accordingly, it is desirable have a voltage sense circuit that does not require multiple power supplies.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

DETAILED DESCRIPTION OF THE DRAWINGS

Figure 1:
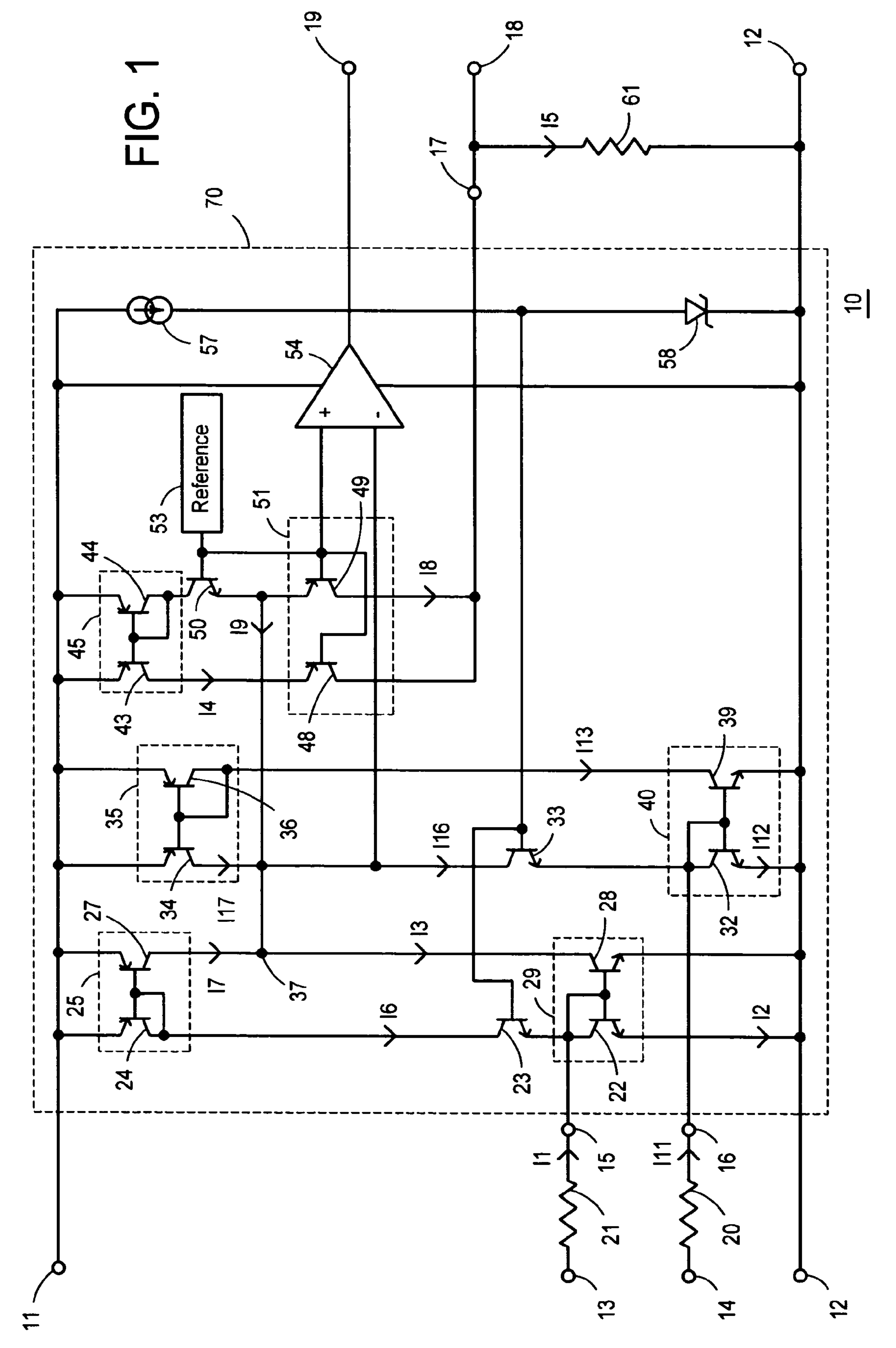
FIG. 1 schematically illustrates a portion of an embodiment of a voltage sense circuits in accordance with the present invention.

FIG. 1 schematically illustrates a voltage sense system 10 that includes a voltage sense circuit 70 that operates from a single power supply voltage. System 10 receives a single operating voltage between a power input 11 and a power return 12. System 10 also receives an alternating current (ac) input voltage between voltage input terminals 13 and 14 and forms a rectified output voltage between an output terminal 18 and return 12. The output voltage generally has a full wave rectified waveform. The output voltage is a rectified representation of the input voltage, such as a harvesine voltage. System 10 also forms a zero crossing (ZC) signal on a zero crossing (ZC) output 19. The ZC signal makes a transition substantially at each zero crossing of the input voltage on terminals 13 and 14. System 10 includes circuit 70, an input resistor 21, an input resistor 20, and an output resistor 61. Resistors 20, 21, and 61 generally are external to circuit 70. As will be seen further hereinafter, the value of resistors 20, 21, and 61 determine the gain of circuit 70. Consequently, resistors 20, 21, and 61 generally are external to circuit 70 to facilitate selecting the value of the resistors. However, in some embodiments one or all of resistors 20, 21, and 61 may be a portion of circuit 70.

Circuit 70 includes input 11, return 12, a first signal input 15, a second signal input 16, a signal output 17, and output 19. Circuit 70 also includes a first current mirror 29 that includes current mirror connected transistors 22 and 28, a second current mirror 25 that includes current mirror connected transistors 24 and 27, a third current mirror 35 that includes current mirror connected transistors 34 and 36, a fourth current mirror 40 that includes current mirror connected transistors 32 and 39, a fifth current mirror 45 that includes current mirror connected transistors 43 and 44, cascode connected transistor 48, and emitter follower connected transistors 49 and 50. Other portions of circuit 70 includes transistor 23 that is connected in series between current mirrors 29 and 25, transistor 33 that is connected in series between current mirrors 35 and 40, a reference generator or reference 53, a comparator 54, a current source 57, and a diode 58. Current source 57 provides a current that biases diode 58. Diode 58 functions as a clamp to fix the value of the voltage applied to a base of transistors 23 and 33 as will be seen further hereinafter.

The voltage applied to terminals 13 and 14 generally is an AC voltage such as a line voltage or household mains. The peak value of such an input voltage varies typically from about one hundred twenty (120) volts in some countries to about two hundred twenty (220) volts in other countries. Circuit 70 has two parallel input structures that process the voltage applied to terminals 13 and 14. The first input structure processes the voltage received on input 13 and includes transistor 23 and current mirrors 29 and 25. The second input structure processes the voltage received on input 16 and includes transistor 33 and current mirrors 35 and 40. The two input structures are coupled together at a common node 37. Each of the two input structures converts the voltage applied to the corresponding input into a current that is representative of the value of the input voltage on the corresponding terminal of terminals 13 and 14. In order to form this current conversion, inputs 15 and 16 are clamped to a reference voltage during each of the positive and negative cycles of the ac input voltage. The voltage formed across diode 58 is applied to the bases of transistors 23 and 33 which functions to provide the reference voltage during one portion of the ac cycle of the input voltage as will be seen further hereinafter.

If the voltage applied to input 13 is within the positive portion of the ac cycle, the positive voltage is coupled through resistor 21 to input 15. Since transistor 22 is configured as a diode, transistor 22 clamps input 15 at a voltage that is substantially equal to the base emitter (Vbe) voltage of transistor 22, typically about 0.7 V. Thus, the value of the voltage applied to terminal 13 is substantially applied across resistor 21 which causes a current I1 to flow through resistor 21 and through transistor 22 as a current I2. Due to the current mirror configuration, current I2 flowing through transistor 22 induces a substantially equal current to flow through transistor 28 as a current I3 that is substantially equal to current I2, thus, substantially equal to current I1. Current I9 is applied to the emitter of transistor 50 which enables transistor 50 and causes current I3 to flow through transistors 44 and 50. The current mirror configuration of transistors 44 and 43 induces a substantially equal current I4 to flow through transistor 43. Current I4 is applied to the emitter of transistor 48 thereby causing current I4 to flow through transistor 48 through output 17 and through resistor 61 as a current I5. Thus, the output voltage between output terminal 18 and return 12 is given by:

$$V=I5*R61.$$

Since currents I5, I4, I3, and I2 are all equal to I1, then:

$$V=I1*R61.$$

Substituting I1=Vin*R21 yields:

$$V=Vin*(R61/R21)$$

where;

V=the output voltage between output terminal 18 and return 12,

Vin=the value of the input voltage on terminal 13,

R61=resistor 61, and

R21=resistor 21.

Consequently the value of the output voltage is equal to the input voltage multiplied by the ratio of resistors 61 and 21.

If the value of the voltage on terminal 13 is in the negative portion of the cycle, the negative portion of the input voltage is applied across resistor 21 and is coupled to input 15 and to the emitter of transistor 23. The base of transistor 23 is held at a voltage substantially equal to the voltage of diode 58. Since diode 58 is a Schottky diode, the base of transistor 23 is held at a voltage of substantially 0.4 V. Due to the Vbe drop of transistor 23, the emitter of transistor 23 is clamped to a voltage of approximately 0.3 volts below the value of the voltage on return 12. Thus, current I1 is a negative current that flows out of input 15 and induces a substantially equal current I6 to flow through transistor 23, thus through transistor 24, out of input 15. Due to the current mirror configuration of transistors 24 and 27, current I6 induces a substantially equal current I7 to flow through transistor 27 to node 37. Current I7 becomes current I9 and is applied to the emitter of transistor 49. The emitter follower configuration of transistor 49 induces a substantially equal current I8 to flow through transistor 49, out through output 17, and as current I5 through resistor 61. Consequently, during the negative portion of the input voltage cycle the value of the output voltage is given by:

$$V=I5*R61.$$

Since currents I5, I8, I7, and I6 are all equal to I1, then:

$$V=I1*R61.$$

Substituting I1=Vin*R21 yields:

$$V=Vin*(R61/R21)$$

Thus, the value of the output voltage is the same for both the positive and the negative portion of the ac cycle of the input voltage.

The second input structure functions substantially equal to the first input structure for the voltage applied to input 16. Transistor 33 functions substantially equal to transistor 23, current mirror 40 functions similar to current mirror 29 and current mirror 35 functions substantially equal to current mirror 25. Similarly to the explanation of the first input structure, if the input voltage on terminal 14 is in the positive half of the ac cycle, diode connected transistor 32 clamps input 16 to the Vbe voltage, substantially 0.7 V, forming a current I11 through resistor 20 and a substantially equal current I12 that flows through transistor 32 and a corresponding current I13 through transistor 39. Due to the current mirror configuration of mirror 35, current I13 induces a substantially equal current I17 to flow through transistor 34 to node 37 and a substantially equal current I9 that is applied to the emitter of transistor 49. Current I9 at the emitter of transistor 49 induces substantially equal current I8 to flow through transistor 49. Current I8 again flows through output 17 and through resistor 61 as current I5.

Similarly to the first input structure, if the input voltage on terminal 14 is in the negative portion of the ac cycle, transistor 33 clamps input 16 similarly to the way transistor 23 clamped input 15 to a voltage of substantially 0.3 V less than the value of voltage on return 12 thereby inducing a current I16 to flow through transistor 33. Current I16 is applied to the emitter of transistor 50 and, due to current mirror 45, causes substantially equal current I4 to flow through transistor 43. Current I4 flows through transistor 48, through output 17, and through resistor 61 as current I5. Thus the output voltage during the negative portion of the cycle is given by:

$$V=Vin*(R61/R20)$$

R21 and R20 typically are equal so that the positive and negative portions of the input voltage form substantially equal portions of the rectified signal on output terminal 18.

In typically operation, currents I1 and I11 are reflected to node 37 and summed together to form a differential current I9 that is applied to the emitters of transistors 49 and 50. The differential current I9 has a full wave rectified waveform that is representative of the ac input voltage received on terminals 13 and 14. Transistors 49 and 50, mirror 45, and transistor 48 function together as a rectifier that receives either a positive or a negative flow of current I9 and responsively forms a positive current. Mirror 45 and transistor 49 assist in changing the direction of the negative current to form a positive current that flows out output 17 as current I5. The common connection of the emitters of transistors 49 and 50 function as an input of the rectifier, and the common connection of the collectors of transistors 48 and 49 function as an output of the rectifier. The net value of the currents summed at node 37 forms current I9 that flows to the rectifier of transistors 49 and 50. If current I9 flows into the rectifier, transistor 49 is active and current I9 flows through transistor 49 as current I8, out output 17, and through resistor 61 as current I5. If current I9 flows out of the rectifier, transistor 50 is active and current I9 flows through transistors 44 and 50, induces current I4 to flow through transistor 43, through output 17, and through resistor 61 as current I5.

Circuit 70 also forms the ZC signal that transitions from one active state to another active state substantially upon the zero crossing of the ac input voltage applied to inputs 13 and 14. The value of the reference voltage (Vref) from reference 53 is applied to the base of transistors 49 and 50 and is used to bias transistors 49 and 50. The value of the reference voltage (Vref) is selected to be large enough to bias transistors 49 and 50 in the active region and ensure that transistors 49 and 50 are not saturated. The non-inverting input of comparator 54 receives Vref. If current I9 flows into the rectifier, transistor 49 is enabled to form a first detection voltage that is applied to the inverting input of comparator 54. The value of the first detection is Vref plus the Vbe of transistor 49 (Vref+Vbe49). Since the inverting input is greater than the non-inverting input, the output of comparator 54 is low. If current I9 flows out of the rectifier, transistor 50 is enabled to apply a second detection voltage to the inverting input of comparator 54. The value of the second detection voltage is Vref minus the Vbe of transistor 50 (Vref−Vbe50). Since the inverting input is less than the non-inverting input, the output of comparator 54 is high. As the input signal applied between inputs 15 and 16 reaches a value substantially equal to the zero crossing, the value of current I9 changes direction and the value of the voltage on the inverting input of comparator 54 swings between (Vref+Vbe49) and (Vref−Vbe49). Thus, the output of comparator 54 quickly transitions for each zero crossing of the input signal applied between inputs 15 and 16.

In order to facilitate this functionality, input 15 is commonly connected to an emitter of transistor 23, a base of transistors 22 and 28, and to a collector of transistor 22. An emitter of transistor 22 is connected to return 12. An emitter of transistor 28 is connected to return 12, and a collector of transistor 28 is commonly connected to node 37 and a collector of transistor 27. An emitter of transistor 27 is connected to an emitter of transistor 24 and to input 11. A collector of transistor 24 is commonly connected to a base of transistor 24, a base of transistor 27, and a collector of transistor 23. Input 16 is commonly connected to the base of transistor 39, a collector and a base of transistor 32, and an emitter of transistor 33. An emitter of transistor 32 is connected to return 12 and to an emitter transistor 39. A collector of transistor 39 is commonly connected to the base of transistor 34, a base of transistor 36, and a collector of transistor 36. An emitter of transistor 36 is connected to an emitter of transistor 34 and to input 11. Collector of transistor 34 is commonly connected to node 37, an inverting input of comparator 54, and a collector for transistor 33. A base of transistor 33 is commonly connected to a base of transistor 23, an anode of diode 58, and a first terminal of current source 57. A second terminal of current source 57 is commonly connected to input 11, an emitter of transistor 44, and an emitter of transistor 43. The collector of transistor 43 is connected to an emitter of transistor 48. The collector of transistor 48 is commonly connected to output 17 and a collector of transistor 49. A base of transistor 48 is commonly connected to a base of transistor 49, a non-inverting input of comparator 54, a base of transistor 50, and an output of reference 53. An emitter of transistor 49 is commonly connected to an emitter of transistor 50 and node 37. A collector of transistor 50 is commonly connected to the base of transistor 43, a base of transistor 44, and a collector of transistor 44. An output of comparator 54 is connected to output 19. A cathode of diode 58 is connected to return 12. A first terminal of resistor 61 is commonly connected to output 17 in output terminal 18, and a second terminal of resistor 61 is connected to return 12.

Figure 2:
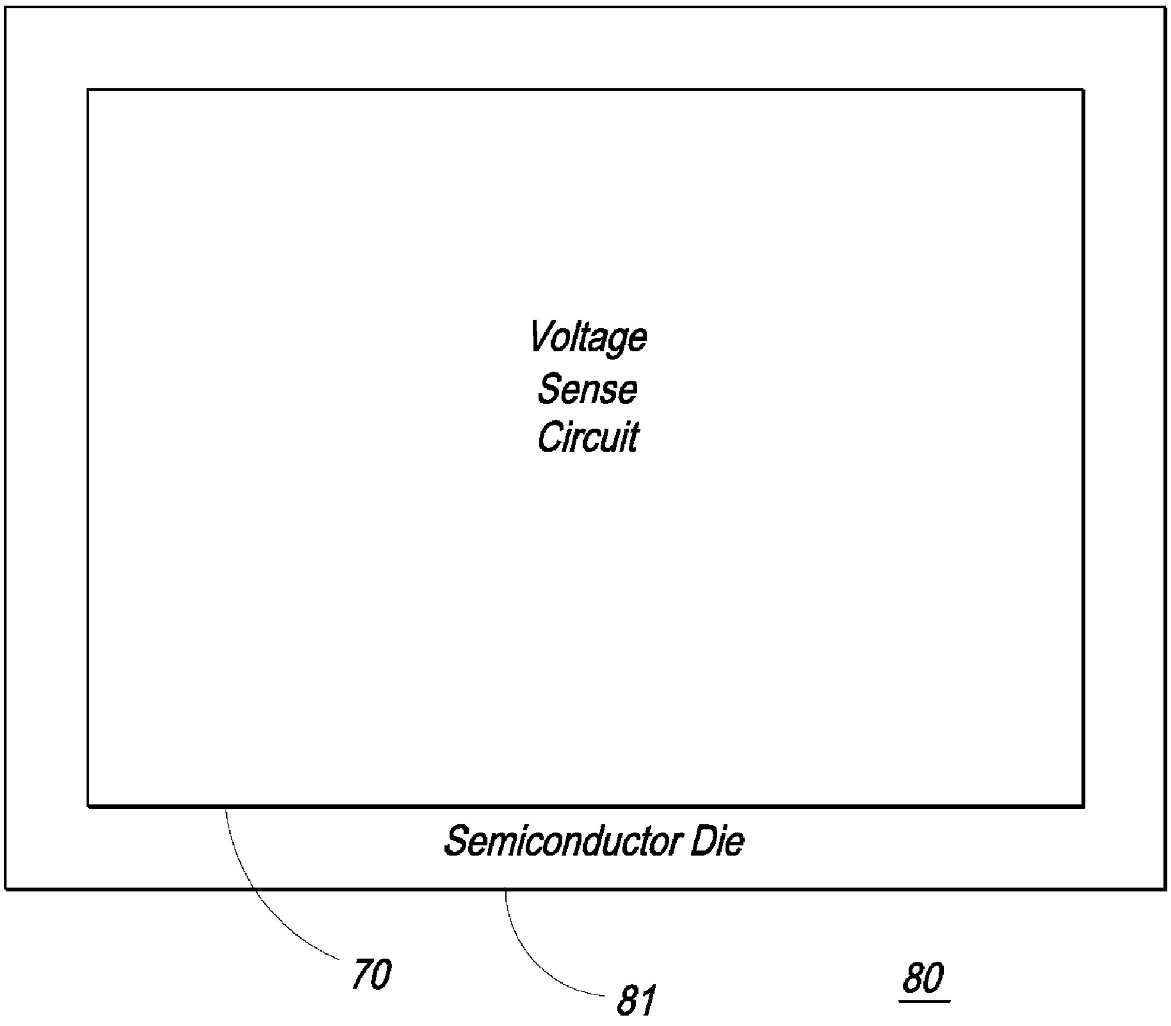
FIG. 2 schematically illustrates an enlarged plan view of a semiconductor device that includes the power system of FIG. 1 in accordance with the present invention.

FIG. 2 schematically illustrates an enlarged plan view of a portion of an embodiment of a semiconductor device 80 that is formed on a semiconductor die 81. Circuit 70 is formed on die 81. Die 81 may also include other circuits that are not shown in FIG. 2 for simplicity of the drawing. Circuit 70 and device 80 are formed on die 81 by semiconductor manufacturing techniques that are well known to those skilled in the art. Typically, die 81 is assembled into a semiconductor package having terminals for inputs 15 and 16, outputs 17 and 19, input 11, and return 12.

In view of all of the above, it is evident that a novel device and method is disclosed. Included, among other features, is forming a voltage sensing circuit that operates from a single power supply thereby reducing system costs. Additionally the voltage sensing circuit doe not require a large number of operational amplifiers thereby further reducing the costs.

While the invention is described with specific preferred embodiments, it is evident that many alternatives and variations will be apparent to those skilled in the semiconductor arts. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A voltage sense circuit comprising:

a voltage input terminal;

a voltage return terminal;

a first input and a second input coupled to receive an ac input signal;

a first current mirror coupled to the first input to convert the ac input signal to a first current that is representative of the ac input signal, the first current mirror including a first transistor having a first current carrying electrode and a control electrode coupled to the first input, and a second current carrying electrode coupled to the voltage return terminal and the first current mirror also including a second transistor having a first current carrying electrode coupled to the second current carrying electrode of the first transistor, a control electrode coupled to the control electrode of the first transistor, and a second current carrying electrode;

a second current mirror coupled to the second input to convert the ac input signal to a second current that is representative of the ac input signal;

a summing node coupled to sum the first current with the second current and form a third current;

a rectifier coupled to receive the third current and form a rectified current that is representative of the ac input signal; and an output of the voltage sense circuit configured to convert the rectified current to a rectified voltage that is representative of the ac input signal.

2. The voltage sense circuit of claim 1 further including a third transistor having a first current carrying electrode coupled to the first input, a control electrode, and a second current carrying electrode.

3. The voltage sense circuit of claim 2 further including a fourth transistor having a first current carrying electrode coupled to the summing node and to the second current carrying electrode of the second transistor, a control electrode, and a second current carrying electrode coupled to the voltage input terminal; and a fifth transistor having a first current carrying electrode coupled to the second current carrying electrode of the fourth transistor, a control electrode and a second current carrying electrode commonly coupled to the control electrode of the fourth transistor and to the second current carrying electrode of the third transistor.

4. The voltage sense circuit of claim 1 wherein the second current mirror coupled to the second input includes a sixth transistor having a first current carrying electrode coupled to the voltage return terminal, a second current carrying electrode and a base electrode connected to the second input;

a seventh transistor having a first current carrying electrode coupled to the first current carrying electrode of the sixth transistor, a control electrode coupled to the control electrode of the sixth transistor, and a second current carrying electrode;

an eighth transistor having a first current carrying electrode connected to the second input, a control electrode coupled to a first voltage reference, and a second current carrying electrode coupled to the summing node;

a ninth transistor having a first current carrying electrode coupled to the summing node, a second current carrying electrode coupled to the voltage input terminal, and a control electrode; and a tenth transistor having a first current carrying electrode coupled to the voltage input terminal, and a second current carrying electrode commonly coupled to a control electrode of the tenth transistor, a control electrode of the ninth transistor, and the second current carrying electrode of the seventh transistor.

5. The voltage sense circuit of claim 1 wherein the rectifier includes a first rectifier transistor having a first current carrying electrode, a control electrode, and also including a second current carrying electrode coupled to the output; and a second rectifier transistor having a first current carrying electrode coupled to the first current carrying electrode of the first rectifier transistor, and a control electrode coupled to the control electrode of the first rectifier transistor.

6. A method of forming a voltage sense circuit comprising:

configuring a first input to form a first current that is representative of an ac input signal, including configuring the voltage sense circuit to clamp the first input to a first voltage to form the first current;

configuring the voltage sense circuit to convert the first current to a second current that is representative of the first current;

configuring a second input to form a third current that is representative of the ac input signal;

configuring the voltage sense circuit to convert the third current to a fourth current that is representative of the third current; and configuring the voltage sense circuit to sum the second current and the fourth current as a fifth current and couple the fifth current for conversion to a rectified output voltage having a value that is representative of a value of the ac input signal.

7. The method of claim 6 further including configuring the voltage sense circuit to rectify the fifth current to form a sixth current and to couple the sixth current for conversion to the rectified output voltage.

8. The method of claim 6 wherein configuring the second input to form the third current that is representative of an ac input signal includes configuring the voltage sense circuit to clamp the second input to a second voltage that is substantially the same as the first voltage.

9. The method of claim 6 further including configuring the voltage sense circuit to use the fifth current to form a zero crossing signal that is representative of a zero crossing of the ac input signal, and couple the fifth current for conversion to a rectified output voltage having a value that is representative of a value of the ac input signal.

10. The method of claim 9 wherein configuring the voltage sense circuit to use the fifth current to form the zero crossing signal that is representative of the zero crossing of the ac input signal includes configuring the voltage sense circuit convert the fifth current to a first detection voltage for a first direction of the fifth current and to convert the fifth current to a second detection voltage for a second direction of the fifth current that is opposite to the first direction wherein the second detection voltage is less than the first detection voltage.

11. The method of claim 6 wherein configuring the voltage sense circuit to convert the first current to the second current includes coupling a first current mirror to receive the first current and form the second current.

12. The method of claim 11 wherein configuring the voltage sense circuit to convert the third current to the fourth current includes coupling a second current mirror to receive the first current and form the second current.

13. A voltage sense method comprising:

coupling an ac input signal to a first input and a second input of a voltage sense circuit;

clamping the first input to a first voltage to convert the ac input signal to a first current;

clamping the second input to a second voltage to convert the ac input signal to a second current;

summing the first current and the second current to form a third current that is representative of the ac input signal;

converting the third current to a fourth current having a haversine waveform that is representative of the ac input signal;

converting the fourth current to a haversine voltage that is representative of the ac input signal; and clamping the first input to a third voltage to convert the ac input signal to a fifth current that is representative of the ac input signal.

14. The method of claim 13 further including using the third current to form a zero crossing signal that is representative of a zero crossing of the ac input signal.

15. The method of claim 14 wherein using the third current to form the zero crossing signal that is representative of a zero crossing of the ac input signal includes converting a first direction of the third current to a first detection voltage and converting a second direction of the third current to a second detection voltage that is less than the first detection voltage.

16. The method of claim 13 further including clamping the second input to a fourth voltage to convert the ac input signal to a sixth current that is representative of the ac input signal and summing the fifth current and the sixth current to form the third current.

17. The voltage sense circuit of claim 1 wherein the first current mirror is configured to clamp the first input to a first voltage and wherein the second current mirror is configured to clamp the second input to a second voltage.

* * * * *